(12) United States Patent
Park et al.

(10) Patent No.: US 11,244,988 B2
(45) Date of Patent: Feb. 8, 2022

(54) INPUT SENSING UNIT AND DISPLAY DEVICE HAVING THE SAME

(71) Applicant: SAMSUNG DISPLAY CO., LTD., Yongin-si (KR)

(72) Inventors: Yong-Hwan Park, Cheonan-si (KR); Miyoung Kim, Hwaseong-si (KR); Soyeon Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/867,893

(22) Filed: May 6, 2020

(65) Prior Publication Data
US 2020/0381487 A1 Dec. 3, 2020

(30) Foreign Application Priority Data
May 30, 2019 (KR) .......................... 10-2019-0063923

(51) Int. Cl.
*G06F 3/041* (2006.01)
*H01L 27/32* (2006.01)

(52) U.S. Cl.
CPC ........ *H01L 27/323* (2013.01); *H01L 27/3276* (2013.01)

(58) Field of Classification Search
CPC ... H01L 27/323; H01L 27/3276; G06F 3/041; G06F 3/045; G06F 3/042; G06F 3/038; G09G 5/00; G01R 27/28
See application file for complete search history.

(56) References Cited

U.S. PATENT DOCUMENTS

| 9,715,313 | B2* | 7/2017 | Ye | G06F 3/0443 |
| 10,067,592 | B2* | 9/2018 | Shin | G06F 3/0443 |
| 2011/0153263 | A1* | 6/2011 | Oda | G06F 3/0446 |
| | | | | 702/150 |
| 2013/0181942 | A1* | 7/2013 | Bulea | G06F 3/0443 |
| | | | | 345/174 |
| 2014/0267137 | A1* | 9/2014 | Solven | G06F 3/0443 |
| | | | | 345/174 |

(Continued)

FOREIGN PATENT DOCUMENTS

| CN | 104793825 | 7/2015 |
| CN | 108717340 | 10/2018 |

(Continued)

*Primary Examiner* — Pegeman Karimi
(74) *Attorney, Agent, or Firm* — F. Chau & Associates, LLC (57) ABSTRACT

An input sensing unit of a display device includes a plurality of sensor units arranged in first and second directions, a plurality of first wirings, and a plurality of second wirings that are respectively connected to the plurality of sensor units. Each of the plurality of sensor units includes a first sensor and a sensor group corresponding to the first sensor and including k number (where k is a positive integer greater than 1) of second sensors arranged in the second direction. First sensors in sensor units arranged in the first direction among the plurality of sensor units are respectively connected to different first wirings among the plurality of first wirings, and first sensors in sensor units arranged in the second direction among the plurality of sensor units are respectively connected to different first wirings among the plurality of first wirings.

18 Claims, 9 Drawing Sheets

(56) References Cited

U.S. PATENT DOCUMENTS

2017/0108965 A1* 4/2017 Kim .................. G06F 3/0443
2017/0344186 A1 11/2017 Na et al.
2020/0371659 A1* 11/2020 Kim .................. G06F 3/04142

FOREIGN PATENT DOCUMENTS

KR  1020170024435   3/2017
KR  1020170136072   12/2017

* cited by examiner

INPUT SENSING UNIT AND DISPLAY DEVICE HAVING THE SAME

CROSS-REFERENCE TO RELATED APPLICATION

This application claims priority under 35 U.S.C. § 119 to Korean Patent Application No. 10-2019-0063923, filed on May 30, 2019 in the Korean Intellectual Property Office, the disclosure of which is incorporated by reference herein in its entirety.

TECHNICAL FIELD

Exemplary embodiments of the inventive concept herein relate to a display device, and more specifically, to a display device including an input sensing unit.

DISCUSSION OF RELATED ART

Various display devices used in multimedia devices such as televisions, mobile phones, tablet computers, navigation systems, or game machines are being developed. An organic light emitting display device displays an image using an organic light emitting diode which generates light by recombination of electrons and holes. Organic light emitting display devices have fast response speeds and can be driven with low power consumption.

Display devices may include an input sensing unit that may provide a touch-based input method which allows a user to easily input information or commands intuitively and conveniently, in addition to a conventional input method such as a button, a keyboard, or a mouse.

SUMMARY

According to an exemplary embodiment of the inventive concept, an input sensing unit includes a plurality of sensor units arranged in a lattice form in a first direction and a second direction crossing the first direction, a plurality of first wirings respectively connected to the plurality of sensor units, and a plurality of second wirings respectively connected to the plurality of sensor units. Each of the plurality of sensor units includes a first sensor and a sensor group corresponding to the first sensor and including k number (where k is a positive integer greater than 1) of second sensors arranged in the second direction. First sensors in x number (where x is a positive integer greater than 1) of sensor units arranged in the first direction among the plurality of sensor units are respectively connected to different first wirings among the plurality of first wirings. First sensors in y number (where y is a positive integer greater than 1) of sensor units arranged in the second direction among the plurality of sensor units are respectively connected to different first wirings among the plurality of first wirings.

In an exemplary embodiment of the inventive concept, the plurality of sensor units may include a first sensor unit and a second sensor unit that are arranged in the second direction. The first sensor unit may include a first sensor group connected to k number of second wirings among the plurality of second wirings, and the second sensor unit may include a second sensor group connected to the k number of second wirings.

In an exemplary embodiment of the inventive concept, the first sensor group may include first to k-th second sensors disposed sequentially in the second direction. The second sensor group may include k-th to first second sensors disposed sequentially in the second direction. The first to k-th second sensors of the first sensor group may be electrically connected to the k-th to first second sensors of the second sensor group, respectively.

In an exemplary embodiment of the inventive concept, the plurality of sensor units may include at least a first sensor column, a sensor column, a third sensor column, and a fourth sensor column that are sequentially arranged in the first direction. A first sensor in a a-th (where a is a positive integer greater than or equal to 1 and less than or equal to y) sensor unit of the first sensor column may be electrically connected to a first sensor in a (y−a+1)th sensor unit of the third sensor column, and a first sensor in a a-th sensor unit of the second sensor column may be electrically connected to a first sensor in a (y−a+1)th sensor unit of the fourth sensor column.

In an exemplary embodiment of the inventive concept, sensor units of the first sensor column and sensor units of the second sensor column may alternately include a first sensor group and a second sensor group in the second direction, and the first sensor group and the second sensor group may be connected to k number of second wirings among the plurality of second wirings.

In an exemplary embodiment of the inventive concept, sensor units of the third sensor column and sensor units of the fourth sensor column may alternately include a third sensor group and a fourth sensor group in the second direction, and the third sensor group and the fourth sensor group may be connected to k number of second wirings different from the k number of second wirings connected to the first sensor group and the second sensor group.

In an exemplary embodiment of the inventive concept, among the plurality of sensor units, x number of sensor units arranged in the first direction and y number of sensor units arranged in the second direction may be defined as a sensor block. The plurality of sensor units may further include a first sensor block and a second sensor block arranged along the first direction. Each of the first sensor block and the second sensor block may include x number of sensor columns sequentially arranged in the first direction.

In an exemplary embodiment of the inventive concept, a first sensor in a a-th (where a is a positive integer greater than or equal to 1 and less than or equal to y) sensor unit among y number of sensor units arranged in an b-th (Where b is a positive integer greater than or equal to 1 and less than or equal to x) sensor column among the x number of sensor columns of the first sensor block may be electrically connected to a first sensor in a a-th sensor unit among y number of sensor units arranged in an b-th sensor column among the x number of sensor columns of the second sensor block.

In an exemplary embodiment of the inventive concept, the second sensor block may further include an end sensor column arranged adjacent to an x-th sensor column of the x number of sensor columns, and the end sensor column may include a plurality of first sensors arranged in the second direction.

In an exemplary embodiment of the inventive concept, a length in the first direction of the first sensor of each of the first sensor units arranged in a first sensor column among the x number of sensor columns of the first sensor block has a first length that may be less than a length in the first direction of the first sensor of each of the first sensor units arranged in the b-th sensor column of the first sensor block, and a length in the first direction of the plurality of first sensors in the end sensor column may be equal to the first length.

In an exemplary embodiment of the inventive concept, the input sensing unit may further include a plurality of first pads connected to the plurality of first wirings, and a plurality of second pads connected to the plurality of second wirings.

In an exemplary embodiment of the inventive concept, the plurality of first wirings may transmit RX signals received from the first sensor of the plurality of sensor units to the plurality of first pads, and the plurality of second wirings may transmit TX signals received from the plurality of second pads to the second sensors of the plurality of sensor units.

In an exemplary embodiment of the inventive concept, each of the RX signals may include electrostatic coupling information of any one of the first sensor and the second sensors in a corresponding sensor unit among the plurality of sensor units.

In an exemplary embodiment of the inventive concept, the first sensor, the second sensors, a corresponding one of the first wirings, and a corresponding one of the second wirings of each of the plurality of sensor units may be disposed on the same layer.

According to an exemplary embodiment of the inventive concept, a display device includes a display panel configured to display an image and including a display region and a non-display region, an input sensing unit disposed on the display panel and including a plurality of sensor units arranged in a lattice form in a first direction and a second direction crossing the first direction, and a plurality of input sensing pads disposed on the non-display region and including first pads and second pads. The input sensing unit may include a plurality of first wirings connected between each of the plurality of sensor units and the first pads, and a plurality of second wirings connected between each of the plurality of sensor units and the second pads. Each of the plurality of sensor units may include a first sensor and a sensor group corresponding to the first sensor and including k number (where k is a positive integer greater than 1) of second sensors arranged in the second direction. First sensors in x number (where x is a positive integer greater than 1) of sensor units arranged in the first direction among the plurality of sensor units may be respectively connected to different first wirings among the plurality of first wirings. First sensors in y number (where y is a positive integer greater than 1) of sensor units arranged in the second direction among the plurality of sensor units may be respectively connected to different first wirings among the plurality of first wirings.

In an exemplary embodiment of the inventive concept, the plurality of sensor units may include a first sensor unit and a second sensor unit that are arranged in the second direction. The first sensor unit may include a first sensor group connected to k number of second wirings among the plurality of second wirings, and the second sensor unit may include a second sensor group connected to the k number of second wirings.

In an exemplary embodiment of the inventive concept, the first sensor group may include first to k-th second sensors disposed sequentially in the second direction. The second sensor group may include k-th to first second sensors disposed sequentially in the second direction. The first to k-th second sensors of the first sensor group may be electrically connected to the k-th to first second sensors of the second sensor group, respectively.

In an exemplary embodiment of the inventive concept, the plurality of sensor units may include at least a first sensor column, a sensor column, a third sensor column, and a fourth sensor column that are sequentially arranged in the first direction. A first sensor a a-th (where a is a positive integer greater than or equal to 1 and less than or equal to y) sensor unit of the first sensor column may be electrically connected to a first sensor in a (y−a+1)th sensor unit of the third sensor column, and a first sensor in a a-th sensor unit of the second sensor column may be electrically connected to a first sensor in a (y−a+1)th sensor unit of the fourth sensor column.

In an exemplary embodiment of the inventive concept, sensor units of the third sensor column and sensor units of the fourth sensor column may alternately include a third sensor group and a fourth sensor group in the second direction, and the third sensor group and the fourth sensor group may be connected to k number of second wirings different from the k number of second wirings connected to the first sensor group and the second sensor group.

In an exemplary embodiment of the inventive concept, among the plurality of sensor units, x number of sensor units arranged in the first direction and y number of sensor units arranged in the second direction may be defined as a sensor block, and the plurality of sensor units may further include a first sensor block and a second sensor block arranged along the first direction. Each of the first sensor block and the second sensor block may include x number of sensor columns sequentially arranged in the first direction.

According to an exemplary embodiment of the inventive concept, an input sensing unit includes a plurality of sensor units arranged in a lattice form in a first direction and a second direction crossing the first direction and including first to x-th sensor unit columns extending in the second direction. Each of the first to x-th sensor unit columns may include first to y-th first sensors disposed sequentially in the second direction and first to y-th sensor groups disposed sequentially in the second direction. Each of the first to y-th sensor groups may include first to k-th second sensors disposed sequentially in the second direction. The first first sensor of the first sensor unit column may be electrically connected to the y-th first sensor of the third sensor unit column. The first first sensor of the second sensor unit column may be electrically connected to the y-th first sensor of the fourth sensor unit column. The first second sensor of the first sensor group of the first sensor unit column may be electrically connected to the k-th second sensor of the second sensor group of the first sensor unit column. x is a positive integer greater than or equal to 4, y is a positive integer greater than 1, and k is a positive integer greater than 1.

BRIEF DESCRIPTION OF THE FIGURES

The above and other features of the inventive concept will be more clearly understood by describing in detail exemplary embodiments thereof with reference to the accompanying drawings.

DETAILED DESCRIPTION OF THE EMBODIMENTS

Exemplary embodiments of the inventive concept provide an input sensing unit having improved input sensing performance and a display device having the same.

Exemplary embodiments of the inventive concept will be described more fully hereinafter with reference to the accompanying drawings. Like reference numerals may refer to like elements throughout this application.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

In the drawings, the thickness, the ratio, and/or the dimensions of elements may be exaggerated for an effective description of technical contents.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the inventive concept. The terms in a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Figure 1:
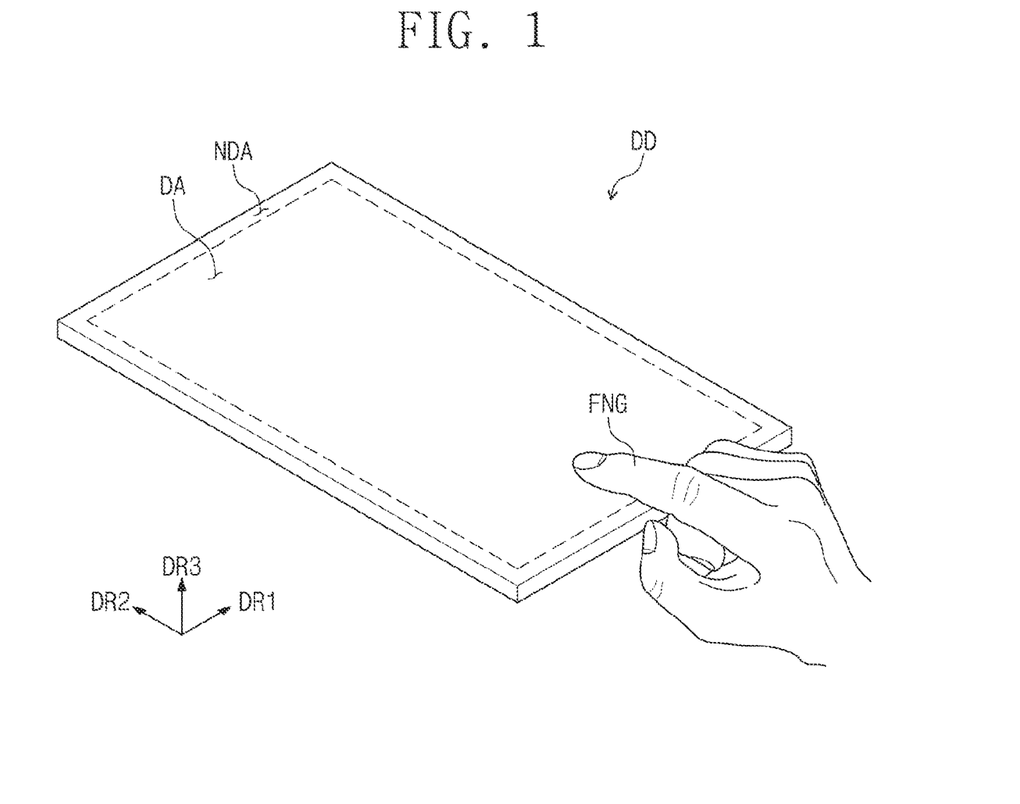
FIG. 1 is a perspective view of a display device according to an exemplary embodiment of the inventive concept.

FIG. 1 is a perspective view of a display device according to an exemplary embodiment of the inventive concept.

Referring to FIG. 1, a display device DD may be a device driven according to an electrical signal. As shown in FIG. 1, the display device DD may be divided into a display region DA and a non-display region NDA.

The display area DA may be a region activated according to an electrical signal. In the present exemplary embodiment of the inventive concept, the display region DA may be a region which senses an external input FNG applied from the outside as an electrical signal is applied.

The external input FNG may be provided in various forms. For example, the external input FNG may include touch, light, and pressure. Touch may include a near touch and a direct touch. The external input FNG may be provided in various forms according to the use of the display device DD.

In the present exemplary embodiment of the inventive concept, the display device DD may be a touch sensing device. Accordingly, the external input FNG may be a direct touch of a user. However, this is only exemplary. The display device DD may include various exemplary embodiments capable of sensing the external input FNG, and is not limited to any one embodiment.

The non-display region NDA is adjacent to the display region DA. The non-display region NDA may be a region on which signal lines or driving elements for transmitting an electrical signal to the display region DA are disposed.

In the present exemplary embodiment of the inventive concept, the non-display region NDA is illustrated as having a frame shape surrounding the display region DA. However, this is only exemplary. The non-display region NDA may be provided in various shapes, or may be omitted.

Figure 2:
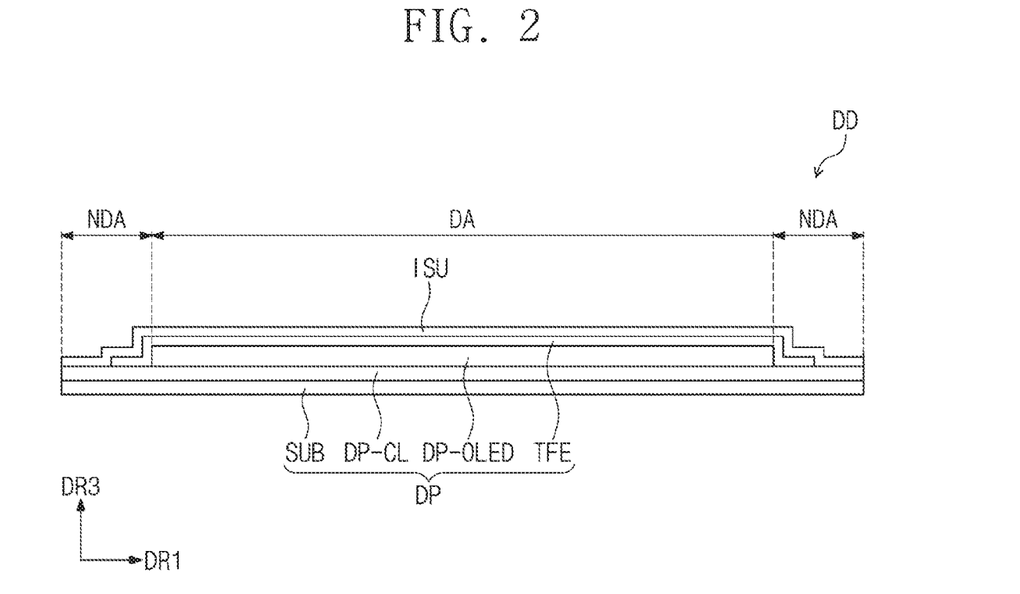
FIG. 2 is a cross-sectional view of the display device of FIG. 1 according to an exemplary embodiment of the inventive concept.

FIG. 2 is a cross-sectional view of the display device of FIG. 1 according to an exemplary embodiment of the inventive concept.

Referring to FIG. 2, the display device DD includes a display panel DP and an input sensing panel ISU. The display device DD according to an exemplary embodiment of the inventive concept may further include a protective member disposed on a lower surface of the display panel DP, and a reflection prevention member and/or a window member disposed on an upper surface of the input sensing unit ISU.

The display panel DP may be a light emitting type display panel, but is not particularly limited thereto. For example, the display panel DP may be an organic light emitting display panel or a quantum dot light emitting display panel. A light emitting layer of the organic light emitting display panel includes an organic light emitting material. A light emitting layer of the quantum dot light emitting display panel includes quantum dots and quantum loads. Hereinafter, the display panel DP will be described as an organic light emitting display panel.

The display panel DP includes a base layer SUB, a circuit element layer DP-CL disposed on the base layer SUB, a display element layer DP-OLED, and a thin film encapsulation layer TFE. The display panel DP may further include functional layers such as a reflection prevention layer and a refractive index control layer.

The base layer SUB may include at least one plastic film. The base layer SUB is a flexible substrate, and may include a plastic substrate, a glass substrate, a metal substrate, or an organic/inorganic composite material substrate. The display region DA and the non-display region NDA described with reference to FIG. 1 may be similarly defined on the base layer SUB.

The circuit element layer DP-CL includes at least one intermediate insulation layer and a circuit element. The intermediate insulation layer includes at least one intermediate inorganic film and at least one intermediate organic film. The circuit element includes signal lines, a driving circuit of a pixel, and the like. A detailed description thereof will be provided below.

The display element layer DP-OLED includes at least organic light emitting diodes. The display element layer DP-OLED may also include an organic film such as a pixel definition film.

The thin film encapsulation layer TFE encapsulates the display element layer DP-OLED. The thin film encapsulation layer TFE includes at least one inorganic film (hereinafter, an encapsulation inorganic film). The thin film encapsulation layer TFE may further include at least one organic film (hereinafter, an encapsulation organic film). The encapsulation inorganic film protects the display element layer DP-OLED from moisture/oxygen, and the encapsulation organic film protects the display element layer DP-OLED from foreign materials such as dust particles. The encapsulation inorganic film may include a silicon nitride layer, a silicon oxynitride layer, a silicon oxide layer, a titanium oxide layer, an aluminum oxide layer, or the like. The encapsulation organic film may include an acrylic organic layer, but is not limited thereto.

The input sensing unit ISU obtains the coordinate information of an external input. The input sensing unit ISU may be formed on the display panel DP by a continuous process, or at least some components may be coupled to one another by an adhesive member.

The input sensing unit ISU may have a multi-layered structure. The input sensing unit ISU may include a single-layered or a multi-layered conductive layer. The input sensing unit ISU may also include a single-layered or a multi-layered insulation layer.

The input sensing unit ISU may sense an external input, for example, in a capacitive manner. The input sensing unit ISU will be described in detail below.

Figure 3:
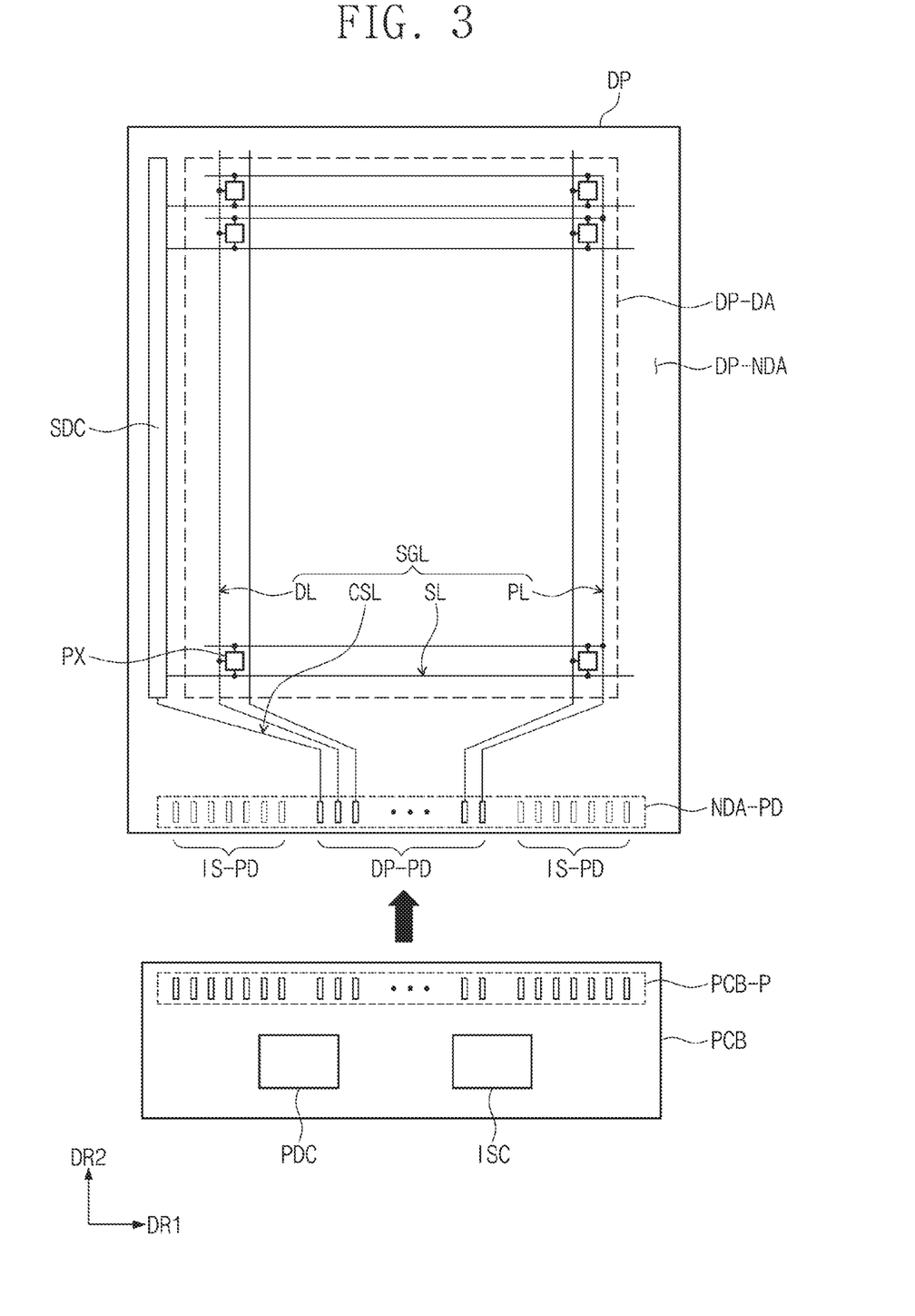
FIG. 3 is a plane view of a display panel according to an exemplary embodiment of the inventive concept.

FIG. 3 is a plane view of a display panel according to an exemplary embodiment of the inventive concept.

As shown in FIG. 3, the display panel DP includes a display region DP-DA and a non-display region DP-NDA. In the present exemplary embodiment of the inventive concept, the non-display region DP-NDA may be defined along the edge of the display region DP-DA. The display region DP-DA and the non-display region DP-NDA of the display panel DP respectively correspond to the display region DA and the non-display region NDA of the display device DD shown in FIG. 1 and FIG. 2.

The display panel DP may include a scan driving circuit SDC, a plurality of signal lines SGL (hereinafter, signal lines), a plurality of signal pads DP-PD (hereinafter, signal pads), and a plurality of pixels PX (hereinafter, pixels). The pixels PX are disposed in the display region DP-DA. Each of the pixels PX includes an organic light emitting diode and a pixel driving circuit connected thereto. The scan driving circuit SDC, the signal lines SGL, the signal pads DP-PD, and the pixel driving circuit may be included in the circuit element layer DP-CL illustrated in FIG. 2.

The scan driving circuit SDC generates a plurality of scan signals (hereinafter, scan signals), and sequentially outputs the scan signals to a plurality of scan lines SL (hereinafter, scan lines) to be described later. The scan driving circuit SDC may further output another control signal to the pixel driving circuit of the pixels PX.

The scan driving circuit SDC may include a plurality of thin film transistors formed through the same process of that of the pixels PX, for example, a Low Temperature Polycrystalline Silicon (LTPS) process or a Low Temperature Polycrystalline Oxide (LTPO) process.

The signal lines SGL include the scan lines SL, data lines DL, a power line PL, and a control signal line CSL. The scan lines SL are respectively connected to corresponding pixels PX among the pixels PX, and the data lines DL are respectively connected to corresponding pixels PX among the pixels PX. The power line PL is connected to the pixels PX. The control signal line CSL may provide control signals to the scan driving circuit SDC.

The signal lines SGL overlap the display region DP-DA and the non-display region DP-NDA. The signal lines SGL may include a pad unit and a line unit. The line unit overlaps the display region DP-DA and the non-display region DP-NDA. The pad unit is connected to an end of the line unit. The pad unit is disposed in the non-display region DP-NDA and overlaps a corresponding signal pad among the signal pads DP-PD. The signal pads DP-PD may be disposed in a pad region NDA-PD within the non-display region DP-NDA.

The line unit connected to the pixel PX constitutes the majority of the signal line SGL. The line unit is connected to transistors of the pixel PX. The line unit may have a single-layered/multi-layered structure, and the line unit may be a single body, or may include two or more other parts. The two or more parts may be disposed on different layers, and may be connected to each other through a contact hole passing through an insulation layer disposed between the two or more parts.

The display panel DP may further include input sensing pads IS-PD disposed on the pad region NDA-PD. The input sensing pads IS-PD are formed through the same process as that of the signal lines SGL, and thus, may be disposed on the same layer as that of the signal lines SGL.

The input sensing pads IS-PD may overlap the pad unit of the signal lines SGL provided in the input sensing unit ISU illustrated in FIG. 2. The input sensing pads IS-PD may be electrically insulated from the signal lines SGL of the display panel DP.

In FIG. 3, a circuit board PCB electrically connected to the display panel DP is further illustrated. The circuit board PCB may be a rigid circuit board or a flexible circuit board. The circuit board PCB may be directly connected to the display panel DP, or may be connected to the display panel DP through another circuit board.

On the circuit board PCB, a panel driving circuit PDC for controlling the operation of the display panel DP may be further disposed. In addition, on the circuit board PCB, an input sensing circuit ISC for controlling the input sensing unit ISU may be disposed. Each of the panel driving circuit PDC and the input sensing circuit ISC may be mounted on the circuit board PCB in the form of an integrated chip. In an exemplary embodiment of the inventive concept, each of the panel driving circuit PDC and the input sensing circuit ISC may be mounted on the circuit board PCB in the form of one integrated chip.

The circuit board PCB may include circuit board pads PCB-P electrically connected to the display panel DP. The circuit board PCB further includes signal lines connecting the circuit board pads PCB-P and the panel driving circuit PDC and/or the input sensing circuit ISC. In an exemplary embodiment of the inventive concept, the panel driving circuit PDC and/or the input sensing circuit ISC may be disposed in the non-display region DP-NDA of the display panel DP.

Figure 4A:
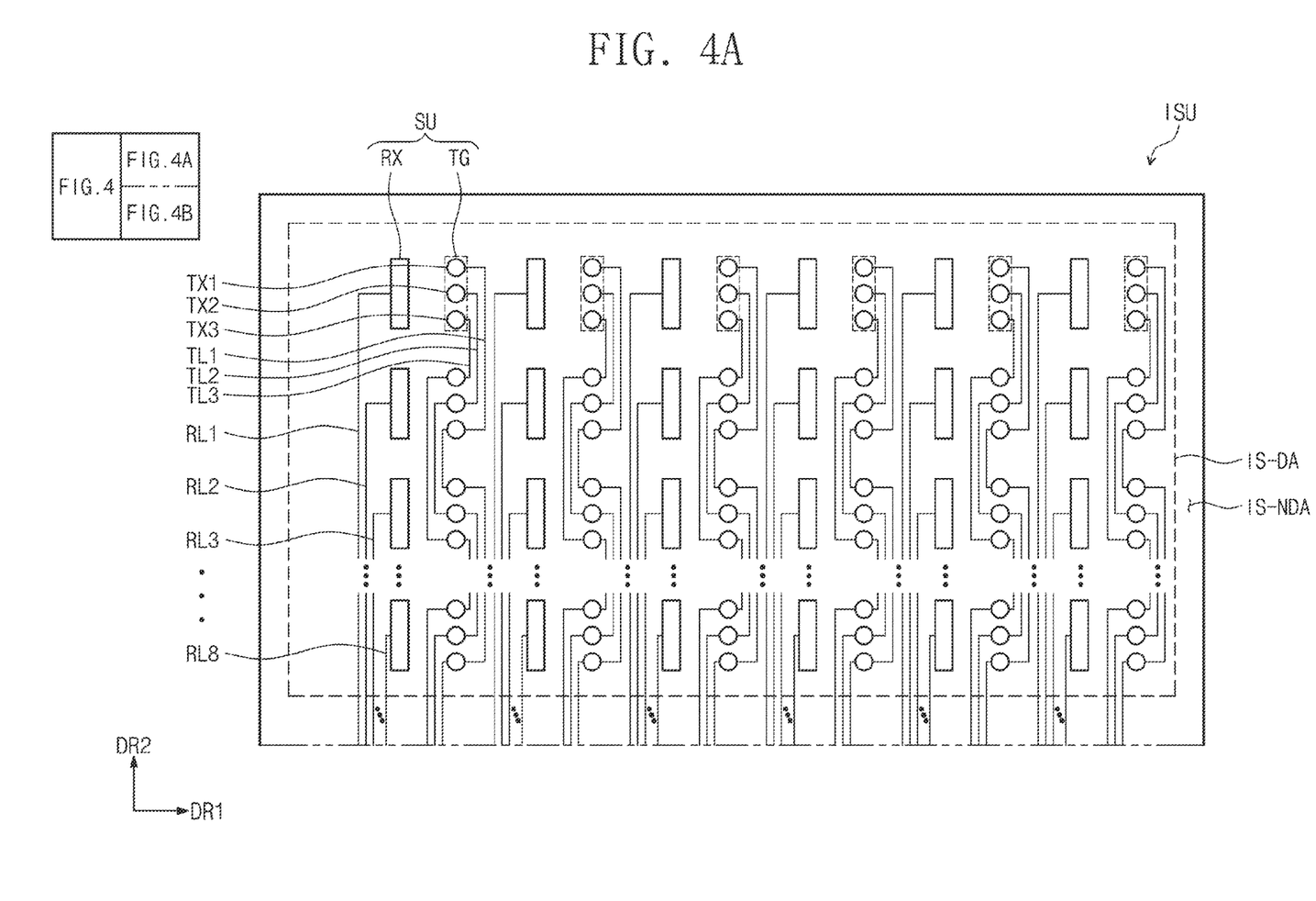
FIG. 4A and FIG. 4B are plan views of an input sensing unit according to an exemplary embodiment of the inventive concept.
Figure 4B:
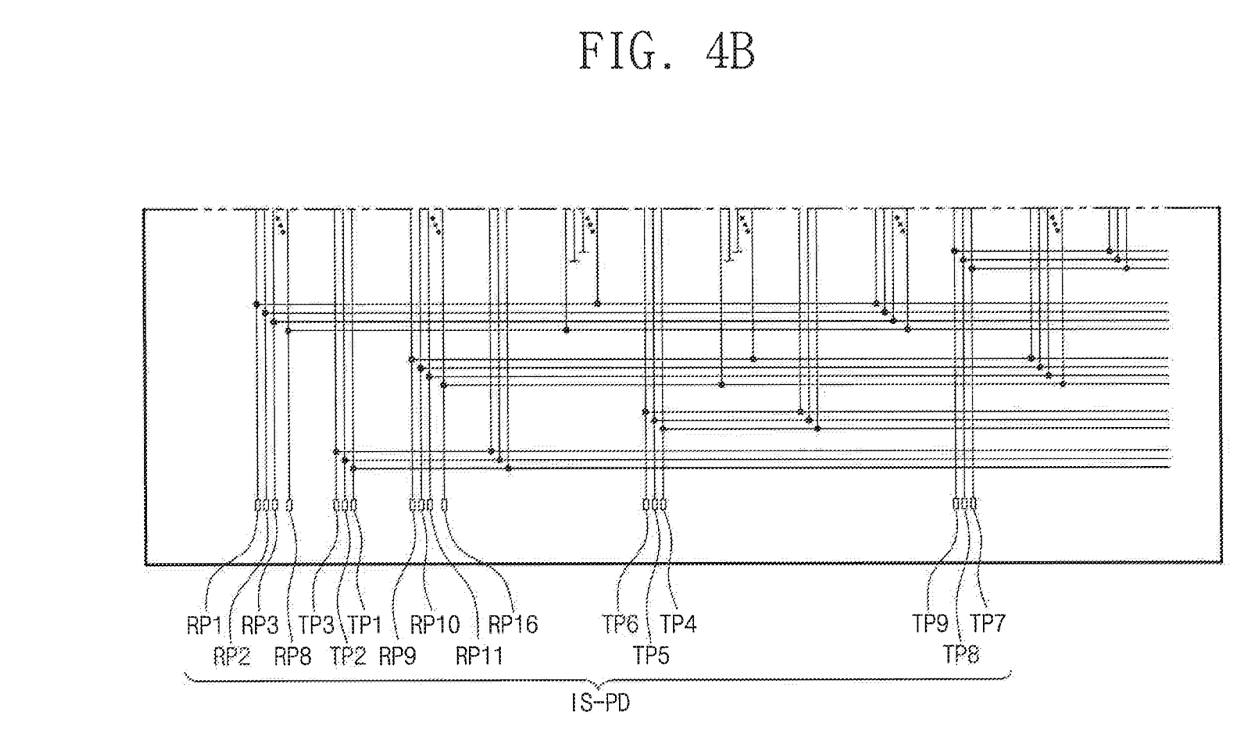

FIG. 4A and FIG. 4B are plan views of an input sensing unit according to an exemplary embodiment of the inventive concept.

As shown in FIG. 4A, the input sensing unit ISU may include a sensing region IS-DA and a wiring region IS-NDA respectively corresponding to the display region DP-DA and the non-display region DP-NDA of the display panel DP. The sensing region IS-DA may be defined as a region in which first sensors RX and second sensors TX1-TX3 to be described later are disposed.

The input sensing unit ISU includes a plurality of sensor units SU, first wirings RL1-RL8, and second wirings TL1-TL3. Each of the plurality of sensor units SU includes one first sensor RX and one sensor group TG. The sensor group TG may include a plurality of second sensors. In an exemplary embodiment of the inventive concept, the sensor group TG includes three second sensors TX1-TX3. The first sensor RX and the second sensors TX1-TX3 may be electrically separated, e.g., insulated from each other. On the right side of the first sensor RX, three second sensors TX1-TX3 may be disposed. The arrangement relationship between the first sensor RX and the second sensors TX1-TX3 may be changed.

The plurality of sensor units SU may be arranged in a lattice form spaced apart from one another in a first direction DR1 and a second direction DR2 crossing the first direction DR1.

Referring to FIG. 4B, in the wiring region IS-NDA of the input sensing unit ISU, the input sensing pads IS-PD may be disposed. The input sensing pads IS-PD include first pads RP1-RP16 and second pads TP1-TP9. The first pads RP1-RP16 and the second pads TP1-TP9 may be electrically connected to the circuit board pads PCB-P shown in FIG. 3. The input sensing circuit ISC generates transmission (TX) signals for driving the input sensing unit ISU. The TX signals received through the second pads TP1-TP9 may be alternating current signals applied to the sensor units SU. For example, the TX signals received through the second pads TP1-TP9 from the input sensing circuit ISC may be transmitted to the second sensors TX1-TX3 through the second wirings TL1-TL3. Additionally, the input sensing circuit ISC calculates the coordinate information of a touch input point from received (RX) signals received from the input sensing unit ISU. The RX signals may be alternating current signals which are the TX signals changed by the sensor units SU according to an external input, and may be transmitted to the input sensing circuit ISC through the first pads RP1-RP16. For example, the RX signal from the first sensor RX may be transmitted to the input sensing circuit ISC through a first wiring RL1 and a first pad RP1. The RX signals may include electrostatic coupling information of any one of the first sensor RX and the second sensors TX1-TX3.

According to an exemplary embodiment of the inventive concept, the first sensor RX, the second sensors TX1-TX3, the first wirings RL1-RL8, and the second wirings TL1-TL3 may be disposed on the same layer.

The input sensing unit ISU illustrated in FIG. 4A and FIG. 4B includes 6 sensor units SU arranged in the first direction DR1 and 8 sensor units SU arranged in the second direction DR2, but the inventive concept is not limited thereto. In addition, depending on the number of sensor units SU included in the input sensing unit ISU, the number and arrangement of the first wirings RL1-RL8, the second wirings TL1-TL3, the first pads RP1-RP16, and the second pads TP1-TP9 may vary.

Figure 5:
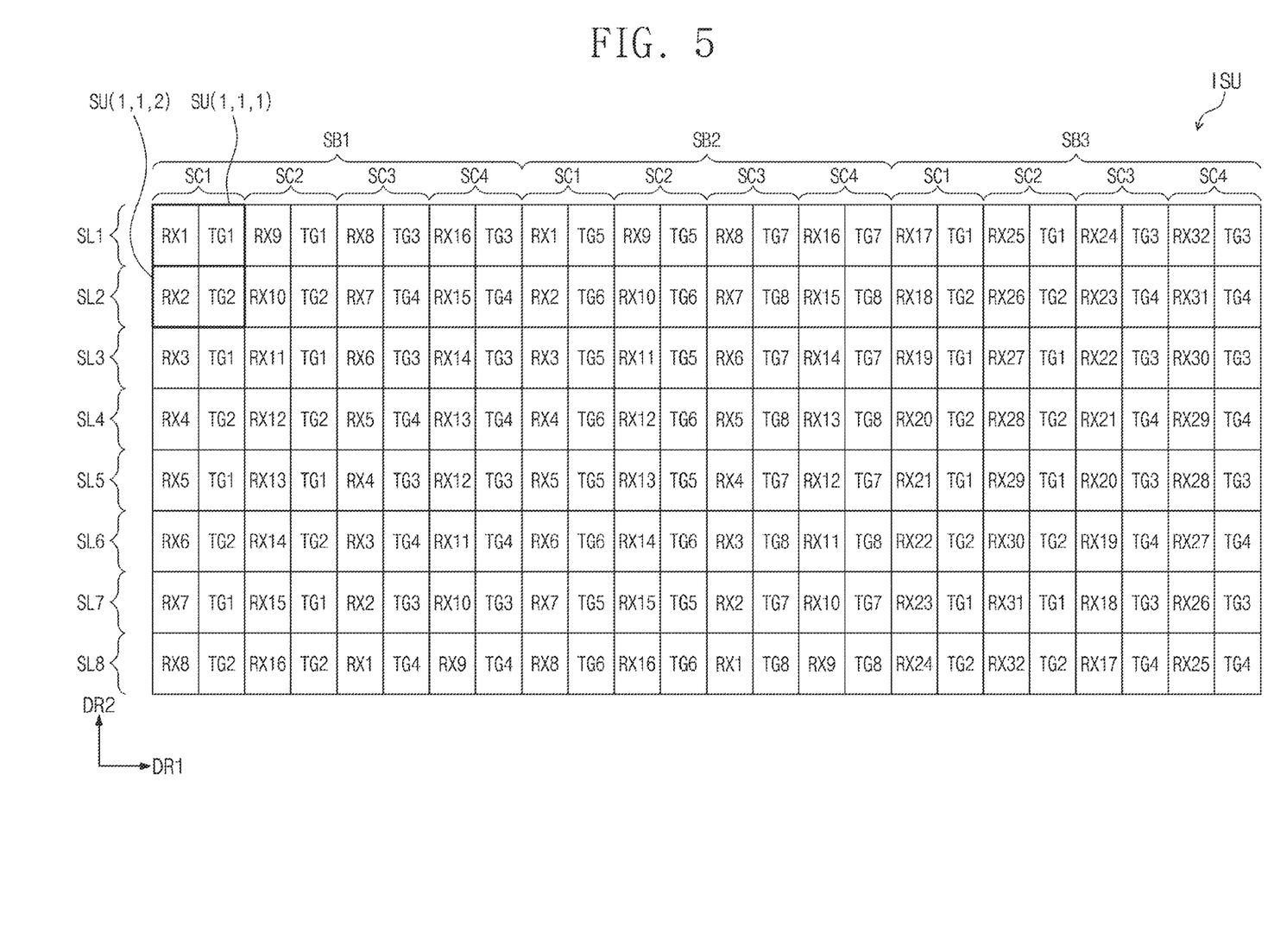
FIG. 5 is a diagram showing sensor units arranged in an input sensing unit according to an exemplary embodiment of the inventive concept.
Figure 6:
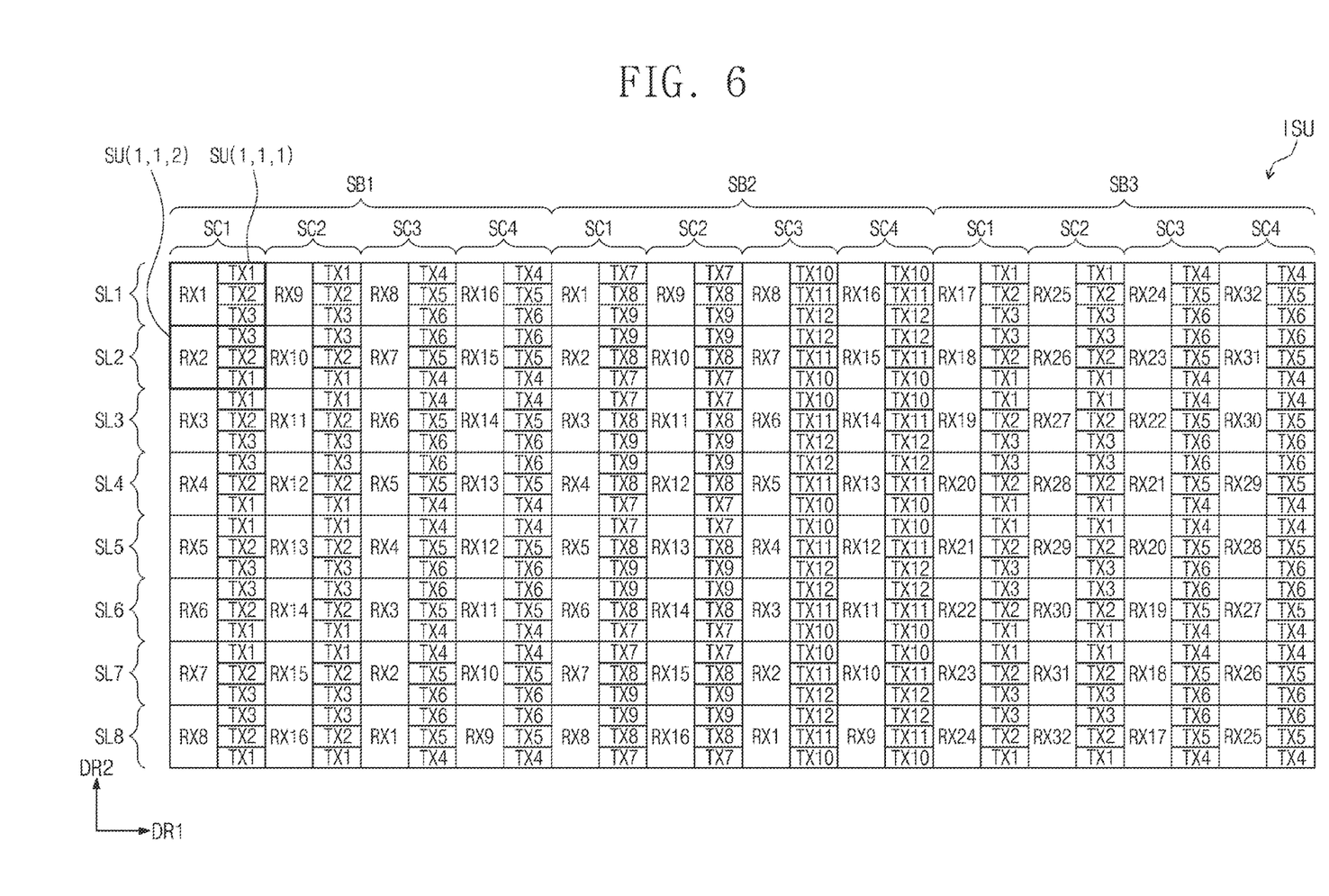
FIG. 6 shows second sensors included in each sensor group of the sensor units of FIG. 5 according to an exemplary embodiment of the inventive concept.

FIG. 5 is a diagram showing sensor units arranged in an input sensing unit according to an exemplary embodiment of the inventive concept. FIG. 6 shows second sensors included in each sensor group of the sensor units of FIG. 5 according to an exemplary embodiment of the inventive concept.

Referring to FIG. 5 and FIG. 6, the input sensing unit ISU may include a plurality of sensor blocks. In an example shown in FIG. 5 and FIG. 6, the input sensing unit ISU includes three sensor blocks SB1, SB2, and SB3. Each of the sensor blocks SB1, SB2, and SB3 may be defined as x number (where x is a positive integer greater than 1) of sensor columns and y number (where y is a positive integer greater than 1) of sensor rows. In the example shown in FIG. 5 and FIG. 6, each of the sensor blocks SB1, SB2, and SB3 includes 4 sensor columns in the first direction DR1, e.g., first to fourth sensor columns SC1-SC4, and 8 sensor rows in the second direction DR2, e.g., first to eighth sensor rows SL1-SL8. Accordingly, each of the first to fourth sensor columns SC1-SC4 includes 8 sensor units SU arranged in the second direction DR2, and each of the first to eighth sensor rows SL1-SL8 includes 4 sensor units SU arranged in the first direction DR1.

In other words, each of the sensor blocks SB1, SB2, and SB3 may include first to fourth sensor units SU arranged in the first direction DR1 and first to eighth sensor units SU arranged in the second direction DR2, e.g., 4×8 number of sensor units SU.

Each of the sensor units SU includes one first sensor and one sensor group. For example, a sensor unit SU (1,1,1) includes a first sensor RX1 and a sensor group TG1. Here, to distinguish the plurality of sensor units SU of the input sensing unit ISU from one another, a sensor unit is indicated by the position of the sensor unit, e.g., (block, sensor column, sensor row). For example, a sensor unit (2,3,6) indicates a sensor unit positioned in a third sensor column SC3 and a sixth sensor row SL6 of a sensor block SB2. A sensor unit SU (1,1,2) includes a first sensor RX2 and a sensor group TG2.

Each sensor group includes k number (where k is a positive integer greater than 1) of second sensors arranged in the second direction DR2. In an exemplary embodiment of the inventive concept, each of the sensor groups includes three second sensors arranged in the second direction DR2, but the inventive concept is not limited thereto. In an example illustrated in FIG. 6, a first sensor group TG1 includes second sensors TX1, TX2, and TX3, and a second sensor group TG2 includes second sensors TX3, TX2, and TX1. The second sensors TX3, TX2, and TX1 included in the sensor groups TG1 and TG2 are substantially the same, but the arrangement order thereof is different.

In other words, in the first sensor group TG1, the second sensors TX1, TX2, and TX3 are sequentially arranged in the second direction DR2, and in the second sensor group TG2, the second sensors TX3, TX2, and TX1 are sequentially arranged in the second direction DR2.

As shown in FIG. 4A, FIG. 5, and FIG. 6, the first sensors having the same reference numeral may be electrically connected to the same first wiring among the first wirings RL1-RL8. The second sensors having the same reference numeral may be electrically connected to the same second wiring among the second wirings TL1-TL3.

First sensors in sensor units arranged in the second direction DR2 in a predetermined sensor column among the first to fourth sensor columns SC1-SC4 of a first sensor block SB1 are connected to different first wirings. For example, the first sensors RX1-RX8 in a first sensor column SC1 are electrically connected to first pads RP1-RP8 through the first wirings RL1-RL8, respectively. First sensors RX9-RX16 in a second sensor column SC2 are electrically connected to first pads RP9-RP16 through first wirings RL9-RL16, respectively. First sensors RX8-RX1 in a third sensor column SC3 are electrically connected to first pads RP8-RP1 through first wirings RL8-RL1, respectively. First sensors RX16-RX9 in a fourth sensor column SC4 are electrically connected to first pads RP16-RP9 through first wirings RL16-RL9, respectively.

A first sensor RX1 in the first sensor column SC1 and a first sensor RX1 in the third sensor column SC3 may be electrically connected to each other through a first wiring RL1. Similarly, a first sensor RX2 in the first sensor column SC1 and a first sensor RX2 in the third sensor column SC3 may be electrically connected to each other through a second wiring RL2.

A first sensor in a a-th (where a is a positive integer greater than or equal to 1 and less than or equal to y) sensor unit of the first sensor column SC1 is electrically connected to a first sensor in a (y−a+1)th sensor unit of the third sensor column. For example, a first sensor RX4 in a 4th (a=4) sensor unit of the first sensor column SC1 is electrically connected to a first sensor RX4 in a 5th (y−a+1=8−4+1=5) sensor unit of the third sensor column SC3. Similarly, a first sensor in a a-th sensor unit of the second sensor column SC2 is electrically connected to a first sensor in a (y−a+1)th sensor unit of the fourth sensor column SC4. For example, a first sensor RX15 in a 7th (a=7) sensor unit of the second sensor column SC2 is electrically connected to a first sensor RX15 in a 2nd (y−a+1=8−7+1=2) sensor unit of the fourth sensor column SC4.

Second wirings TL1, TL2, and TL3 connect second sensors TX1, TX2, and TX3 in different sensor units. For example, a second wiring TL1 electrically connects a second sensor TX1 in the sensor unit SU (1,1,1) to a second sensor TX1 in the sensor unit (1,1,2). A second wiring TL2 electrically connects a second sensor TX2 in the sensor unit SU (1,1,1) to a second sensor TX2 in the sensor unit (1,1,2). A second wiring TL3 electrically connects a second sensor TX3 in the sensor unit SU (1,1,1) to a second sensor TX3 in the sensor unit (1,1,2).

In other words, the first sensor group TG1 may include first to k-th second sensors disposed sequentially in the second direction (e.g., TX1 to TX3). The second sensor group TG2 may include k-th to first second sensors disposed sequentially in the second direction (e.g., TX3 to TX1). The first to k-th second sensors of the first sensor group TG1 may be electrically connected to the k-th to first second sensors of the second sensor group TG2, respectively.

Sensor units of the first sensor column SC1 and the second sensor column SC2 of the first sensor block SB1 alternately include the first sensor group TG1 and the second sensor group TG2 in the second direction DR2. Sensor units of the third sensor column SC3 and the fourth sensor column SC4 of the first sensor block SB1 alternately include a third sensor group TG3 and a fourth sensor group TG4 in the second direction DR2. The third sensor group TG3 includes second sensors TX4, TX5, and TX6 arranged in the second direction DR2, and the fourth sensor group TG4 includes second sensors TX6, TX5, and TX4 arranged in the second direction DR2.

A first sensor (e.g., RX1) in a a-th sensor unit among y number of sensor units arranged in an b-th sensor column among x number of sensor columns of the first sensor block SB1 is electrically connected to a first sensor (e.g., RX1) in a a-th sensor unit among y number of sensor units arranged in the b-th sensor column of the second sensor block SB2. Here, a is a positive integer greater than or equal to 1 and less than or equal to y, and b is a positive integer greater than or equal to 1 and less than or equal to x.

For example, first sensors RX1-RX8 included in each of sensor units arranged in the first sensor column SC1 of the first sensor block SB1 is electrically connected to first sensors RX1-RX8 included in each of sensor units arranged in the first sensor column SC1 of the second sensor block SB2 through the first wirings RL1-RL8. In addition, first sensors RX9-RX16 included in each of sensor units arranged in the second sensor column SC2 of the first sensor block SB1 is electrically connected to first sensors RX9-RX16 included in each of sensor units arranged in the second sensor column SC2 of the second sensor block SB2 through the first wirings RL9-RL16.

Sensor units of the first sensor column SC1 and the second sensor column SC2 of the second sensor block SB2 alternately include a fifth sensor group TG5 and a sixth sensor group TG6 in the second direction DR2. The fifth sensor group TG5 includes second sensors TX7, TX8, and TX9 arranged in the second direction DR2, and the sixth sensor group TG6 includes second sensors TX9, TX8, and TX7 arranged in the second direction DR2.

Sensor units of the third sensor column SC3 and the fourth sensor column SC4 of the second sensor block SB2 alternately include a seventh sensor group TG7 and an eighth sensor group TG8 in the second direction DR2. The seventh sensor group TG7 includes second sensors TX10, TX11, and TX12 arranged in the second direction DR2, and the eighth sensor group TG8 includes second sensors TX12, TX11, and TX10 arranged in the second direction DR2.

Each of sensor units SU arranged in the first direction DR1 and sensor units SU arranged in the second direction DR2 of the first sensor block SB1 includes the same first sensor as those of sensor units SU arranged in the first direction DR1 and sensor units SU arranged in the second direction DR2 of the second sensor block SB2. On the other hand, each of the sensor units SU in the first sensor block SB1 includes any one of the first sensor group TG1 to the fourth sensor group TG4, but each of the sensor units SU in the sensor block SB2 includes any one of the fifth sensor group TG5 to the eighth sensor group TG8.

Accordingly, each of sensor units SU including a predetermined first sensor among the sensor units SU in the first sensor block SB1 and the second sensor block SB2 includes different sensor groups. For example, the sensor unit SU (1,1,1) of the first sensor block SB1 and the sensor unit SU (2,1,1) of the second sensor block SB2, each including the first sensor RX1, respectively include the first sensor group TG1 and the fifth sensor group TG5. Additionally, a sensor unit SU (1,3,8) of the first sensor block SB1 including the first sensor RX1 includes the fourth sensor group TG4, but a sensor unit SU (2,3,8) of the second sensor block SB2 includes the eighth sensor group TG8.

Since some of the sensor units SU of the first sensor block SB1 and the second sensor block SB2 include the same first sensor (e.g., electrically connected to each other), the number of the first pads illustrated in FIG. 4B may be reduced. In addition, since the sensor units SU including the same first sensor include different sensor groups, the touch input position of the input sensing circuit ISC (shown in FIG. 3) may be accurately determined.

Meanwhile, each of the sensor units SU arranged in the first direction DR1 and the sensor units SU arranged in the second direction DR2 of the first sensor block SB1 includes the same sensor group as those of sensor units SU arranged in the first direction DR1 and sensor units SU arranged in the second direction DR2 of the third sensor block SB3. On the other hand, each of the sensor units SU in the first sensor block SB1 includes any one of first sensors RX1-RX16, but each of the sensor units SU in the third sensor block SB3 includes any one of first sensors RX17-RX32.

Accordingly, each of sensor units SU including a predetermined sensor group among the sensor units SU in the first sensor block SB1 and the third sensor block SB3 includes different first sensors. For example, the sensor unit SU (1,1,1) of the first sensor block SB1 including the first sensor group TG1 includes the first sensor RX1, but a sensor unit SU (3,1,1) of the second sensor block SB2 including the first sensor group TG1 includes a first sensor RX17. As another example, a sensor unit SU (1,1,3) of the first sensor block SB1 including the first sensor TG1 includes a first sensor RX3, but a sensor unit SU (3,1,3) of the third sensor block SB3 including the first sensor group TG1 includes a first sensor RX19.

Since some of the sensor units SU of the first sensor block SB1 and the third sensor block SB3 include the same sensor group (e.g., electrically connected to each other), the number of the second pads illustrated in FIG. 4B may be reduced. In addition, since the sensor units SU including the same sensor group include different first sensors, the touch input position of the input sensing circuit ISC (shown in FIG. 3) may be accurately determined.

Figure 7:
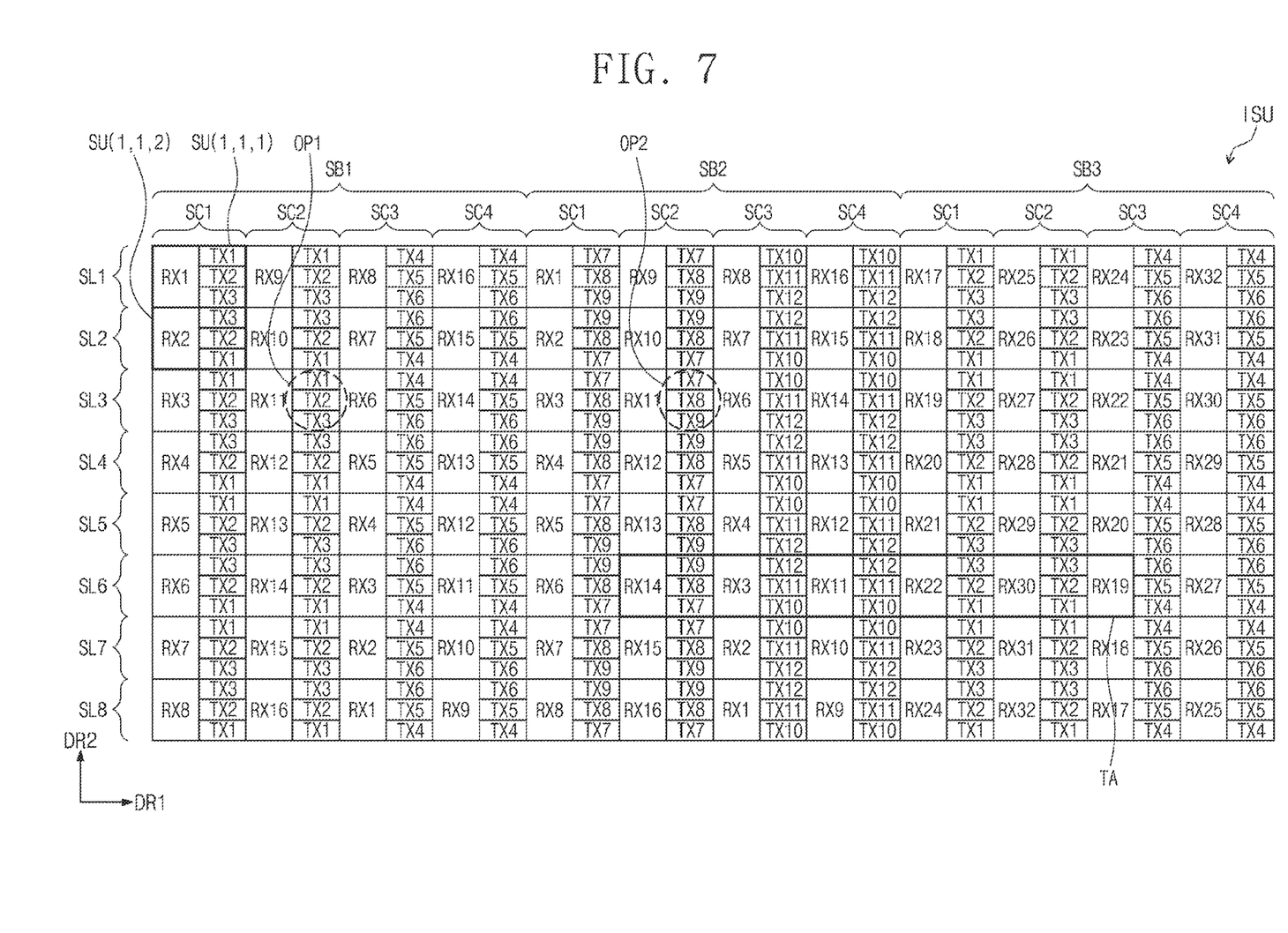
FIG. 7 is a view for describing an input sensing unit according to an exemplary embodiment of the inventive concept.

FIG. 7 is a view for describing an input sensing unit according to an exemplary embodiment of the inventive concept.

Referring to FIG. 7, the input sensing unit ISU may independently detect a first external input OP1 and a second external input OP2 in a mutual capacitance manner.

When the first external input OP1 occurs, capacitance between first sensors RX11 and RX6 and the second sensors TX1, TX2, and TX3 is changed. The input sensing circuit ISC (shown in FIG. 3) may obtain the coordinate information of the first external input OP1 from RX signals received from the first sensors RX11 and RX6.

When the second external input OP2 occurs, capacitance between first sensors RX11 and RX6 and the second sensors TX7, TX8, and TX9 is changed. The input sensing circuit ISC (shown in FIG. 3) may obtain the coordinate information of the second external input OP2 from the RX signals received from the first sensors RX11 and RX6.

For example, the input sensing circuit ISC of FIG. 3 may add an RX signal received from the first sensor RX11 and an RX signal received from the first sensor RX6 to detect the first external input OP1 and the second external input OP2.

Meanwhile, a user may input a touch while moving a finger or the like in a touch region TA. For example, to switch an application screen or to move a widget, an icon, or the like, the user may perform a touch slide by moving a predetermined distance while keeping a finger in contact with the touch region TA. In this case, since first sensors RX14, RX3, RX11, RX22, RX30, and RX19 in the first direction DR1 in the touch region TA are different from each other, the input sensing circuit ISC (shown in FIG. 3) may accurately determine the position of the touch.

Figure 8:
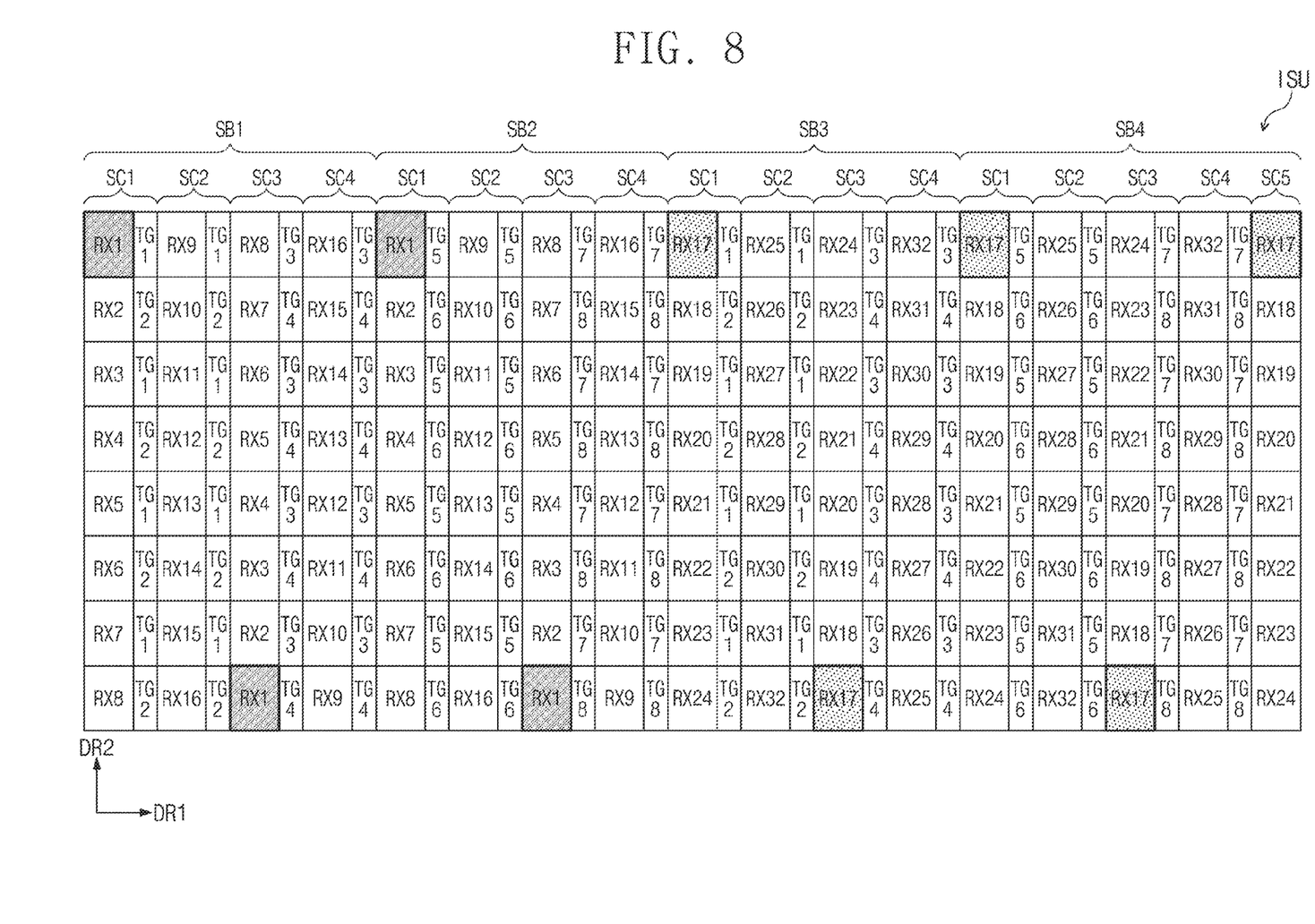
FIG. 8 is a view showing an input sensing unit which includes sensor blocks according to an exemplary embodiment of the inventive concept.

FIG. 8 is a view showing an input sensing unit which includes sensor blocks according to an exemplary embodiment of the inventive concept.

Referring to FIG. 8, the input sensing unit ISU includes four sensor blocks SB1-SB4. Each of the sensor blocks SB1-SB4 includes sensor units similar to those of the sensor blocks SB1-SB3 shown in FIG. 6, and thus, a duplicate description thereof will be omitted.

A sensor block SB4, which is the last sensor block, further includes an end sensor column SC5. The end sensor column SC5 includes first sensors RX17-RX24 only.

As described above, the input sensing circuit ISC of FIG. 3 calculates, based on a TX signal transmitted to a second sensor, coordinate information based on the change in capacitance between the second sensor and a first sensor arranged on the left side of the second sensor and capacitance between the second sensor and a first sensor arranged on the right side of the second sensor. Since the sensor block SB4 further includes the end sensor column SC5, the input sensing circuit ISC may sense the change in capacitance of the first sensors RX17-RX24 in addition to that of first sensors RX32-RX25 arranged on the left side of the seventh sensor group TG7 and the eighth sensor group TG8 in sensor units SU (4, 1, 1)-SU (4,1,8) arranged in the fourth sensor column SC4 of the sensor block SB4.

Figure 9:
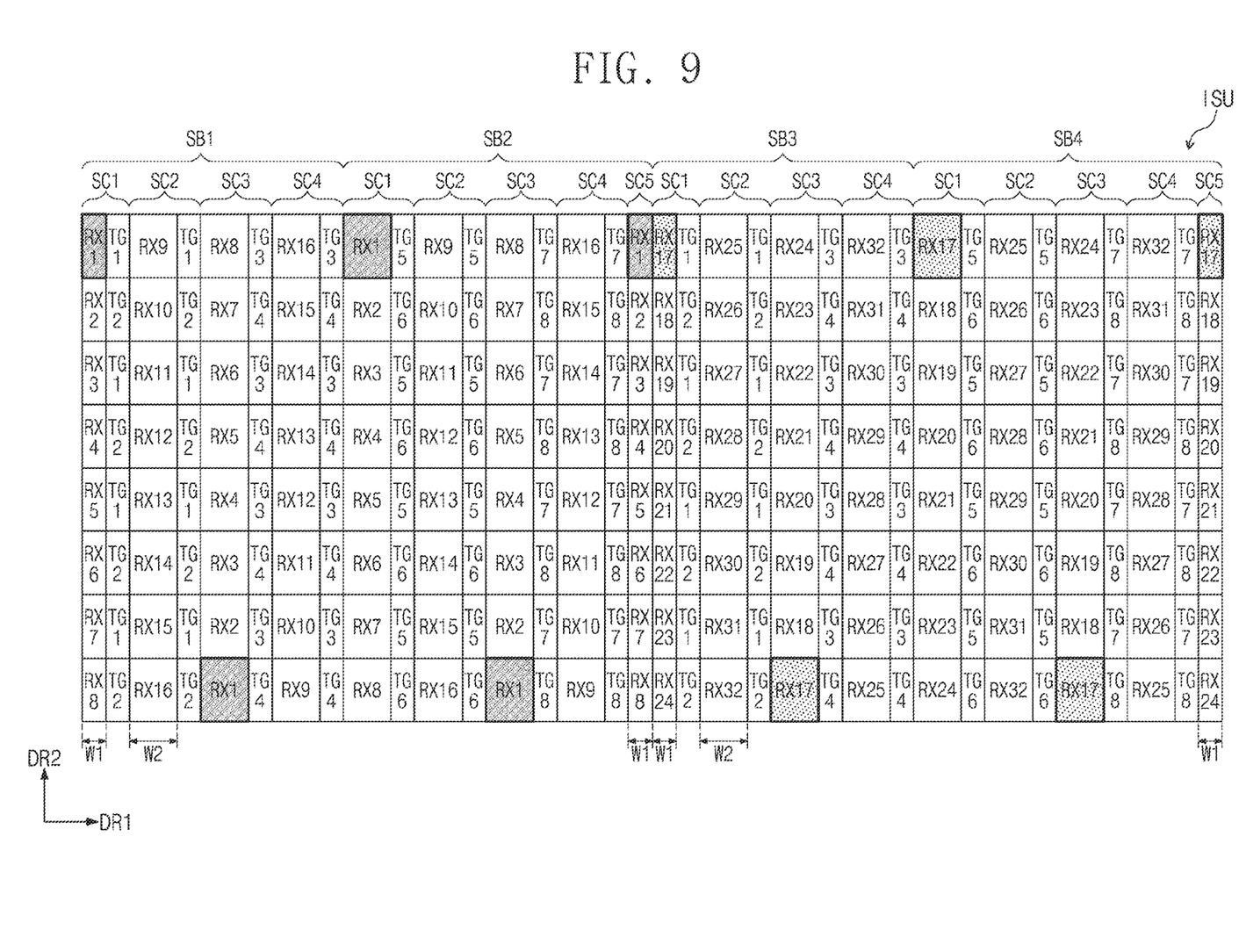
FIG. 9 is a view showing an input sensing unit which includes sensor blocks according to an exemplary embodiment of the inventive concept.

FIG. 9 is a view showing an input sensing unit which includes sensor blocks according to an exemplary embodiment of the inventive concept.

Referring to FIG. 9, the input sensing unit ISU includes the four sensor blocks SB1-SB4. Each of the sensor blocks SB1-SB4 includes sensor units similar to that of the sensor blocks SB1-SB3 shown in FIG. 6, and thus, a duplicate description thereof will be omitted.

The sensor block SB2 shown in FIG. 9 further includes the end sensor column SC5 in addition to the first to fourth sensor columns SC1-SC4. Similarly, the sensor block SB4 further includes the end sensor column SC5 in addition to the first to fourth sensor columns SC1-SC4.

The end sensor column SC5 of the sensor block SB2 includes the same first sensors RX1-RX8 as the first sensors RX1-RX8 in the first sensor column SC1 of the sensor block SB1, and the end sensor column SC5 of the sensor block SB4 includes the same first sensors RX17-RX24 as the first sensors RX17-RX24 in the first sensor column SC1 of the sensor block SB3.

As previously described with reference to FIG. 8, the sensor block SB4, which is the last sensor block, further includes the end sensor column SC5. Accordingly, the number of each of the first sensors RX1-RX8 disposed on the leftmost side in the input sensing unit ISU is different from the number of each of the first sensors RX17-RX24 disposed on the rightmost side therein. For example, in the input sensing unit ISU, there are 4 first sensors RX1 and 5 first sensors RX17. As such, when the number of first sensors located at the edge of the input sensing unit ISU is different, the input sensing circuit ISC (shown in FIG. 3) requires a complicated algorithm for calculating capacitance.

The input sensing unit ISU shown in FIG. 9 further includes the sensor column SC5 in the sensor block SB2 so as to allow the number of the first sensors located at the edge to be equal. For example, in the input sensing unit ISU, there are 5 first sensors RX1 and also 5 first sensors RX17.

Additionally, since the number first sensors RX1-RX8 and RX17-RX24 located at the edge of the input sensing unit ISU is 5 and the number of first sensors RX9-RX16 and RX25-RX32 located therein is 4, there may be a difference in the capacitance thereof.

Referring to FIG. 9, a length W1 of each of the first sensors RX1-RX8 in the first sensor column SC1 of the sensor block SB1, the first sensors RX1-RX8 in the end sensor column SC5 of the sensor block SB2, the first sensors RX17-RX24 in the first sensor column SC1 of the sensor block SB3, and the first sensors RX17-RX24 in the end sensor column SC5 of the sensor block SB4 in the first direction DR1 is less than a length W2 of the first sensors RX9-RX16 and RX25-RX32 in the first direction DR1 (for example, W1=½×W2). As such, to improve the uniformity of the first sensors RX1-RX32 in the input sensing unit ISU, the width and length of each of the first sensors RX1-RX32 may be changed in various ways.

An input sensing unit having such a configuration may accurately sense the position of a touch input since the combination of a RX sensor and a TX sensor is not duplicated. In addition, by allowing TX sensors receiving the same TX signal to correspond to RX sensors that are not electrically connected to each other, the number of TX signal lines and pads may be minimized. Accordingly, the input sensing performance of a display device including an input sensing unit according to exemplary embodiments of the inventive concept may be improved and the number of signal pads may be reduced.

While the inventive concept has been shown and described with reference to exemplary embodiments thereof, it will be understood by those of ordinary skill in the art that various changes in form and details may be made thereto without departing from the spirit and scope of the inventive concept as set forth by the appended claims.

What is claimed is:

1. An input sensing unit comprising:
a first to fourth sensor columns disposed sequentially in a first direction, and including a plurality of sensor units, respectively;
a plurality of first wirings respectively connected to the plurality of sensor units; and
a plurality of second wirings respectively connected to the plurality of sensor units,
wherein each of the plurality of sensor units includes:
a first sensor; and
a sensor group corresponding to the first sensor and including k number (where k is a positive integer greater than 1) of second sensors arranged in a second direction crossing the first direction,
wherein first sensors in x number (where x is a positive integer greater than 1) of sensor units arranged in the first direction among the plurality of sensor units are respectively connected to different first wirings among the plurality of first wirings,
wherein first sensors in y number (where y is a positive integer greater than 1) of sensor units arranged in the second direction among the plurality of sensor units are respectively connected to different first wirings among the plurality of first wirings,
wherein the first to fourth sensor columns includes first to y-th first sensors, respectively,
wherein the first to y-th first sensors of the first sensor column are electrically connected to the y-th to first first sensors of the second sensor column, respectively, and
wherein the first to y-th first sensors of the third sensor column are electrically connected to the y-th to first first sensors of the fourth sensor column, respectively.

2. The input sensing unit of claim 1, wherein the plurality of sensor units comprise a first sensor unit and a second sensor unit that are arranged in the second direction,
the first sensor unit includes a first sensor group connected to k number of second wirings among the plurality of second wirings, and
the second sensor unit includes a second sensor group connected to the k number of second wirings.

3. The input sensing unit of claim 2, wherein
the first sensor group includes first to k-th second sensors disposed sequentially in the second direction,
the second sensor group includes k-th to first second sensors disposed sequentially in the second direction, and
the first to k-th second sensors of the first sensor group are electrically connected to the k-th to first second sensors of the second sensor group, respectively.

4. The input sensing unit of claim 1, wherein
sensor units of the first sensor column and sensor units of the second sensor column alternately comprise a first sensor group and a second sensor group in the second direction, and
the first sensor group and the second sensor group are connected to k number of second wirings among the plurality of second wirings.

5. The input sensing unit of claim 4, wherein
sensor units of the third sensor column and sensor units of the fourth sensor column alternately comprise a third sensor group and a fourth sensor group in the second direction, and
the third sensor group and the fourth sensor group are connected to k number of second wirings different from the k number of second wirings connected to the first sensor group and the second sensor group.

6. The input sensing unit of claim 1, wherein
among the plurality of sensor units, x number of sensor units arranged in the first direction and y number of sensor units arranged in the second direction are defined as a sensor block,
the plurality of sensor units further includes a first sensor block and a second sensor block arranged along the first direction, and
each of the first sensor block and the second sensor block comprises x number of sensor columns sequentially arranged in the first direction.

7. The input sensing unit of claim 6, wherein
a first sensor in a a-th (where a is a positive integer greater than or equal to 1 and less than or equal to y) sensor unit among y number of sensor units arranged in an b-th (where b is a positive integer greater than or equal to 1 and less than or equal to x) sensor column among the x number of sensor columns of the first sensor block is electrically connected to a first sensor in a a-th sensor unit among y number of sensor units arranged in an b-th sensor column among the x number of sensor columns of the second sensor block.

8. The input sensing unit of claim 7, wherein the second sensor block further comprises an end sensor column arranged adjacent to an x-th sensor column of the x number of sensor columns, and
the end sensor column includes a plurality of first sensors arranged in the second direction.

9. The input sensing unit of claim 8, wherein
a length in the first direction of the first sensor of each of sensor units arranged in a first sensor column among the x number of sensor columns of the first sensor block has a first length that is less than a length in the first direction of the first sensor of each of sensor units arranged in the b-th sensor column of the first sensor block, and
a length in the first direction of the plurality of first sensors in the end sensor column is equal to the first length.

10. The input sensing unit of claim 1, further comprising
a plurality of first pads connected to the plurality of first wirings; and
a plurality of second pads connected to the plurality of second wirings.

11. The input sensing unit of claim 10, wherein
the plurality of first wirings transmit RX signals received from the first sensor of the plurality of sensor units to the plurality of first pads, and
the plurality of second wirings transmit TX signals received from the plurality of second pads to the second sensors of the plurality of sensor units.

12. The input sensing unit of claim 11, wherein each of the RX signals comprises electrostatic coupling information of any one of the first sensor and the second sensors in a corresponding sensor unit among the plurality of sensor units.

13. The input sensing unit of claim 1, wherein the first sensor, the second sensors, a corresponding one of the first wirings, and a corresponding one of the second wirings of each of the plurality of sensor units are disposed on the same layer.

14. A display device comprising:
a display panel configured to display an image and including a display region and a non-display region;
an input sensing unit disposed on the display panel and including a plurality of sensor units arranged in a lattice form in a first direction and a second direction crossing the first direction; and
a plurality of input sensing pads disposed on the non-display region and including first pads and second pads,
wherein the input sensing unit includes:
a plurality of first wirings connected between each of the plurality of sensor units and the first pads; and
a plurality of second wirings connected between each of the plurality of sensor units and the second pads,
wherein each of the plurality of sensor units includes:
a first sensor, and
a sensor group corresponding to the first sensor and including k number (where k is a positive integer greater than 1) of second sensors arranged in the second direction,
wherein first sensors in x number (where x is a positive integer greater than 1) of sensor units arranged in the first direction among the plurality of sensor units are respectively connected to different first wirings among the plurality of first wirings,
wherein first sensors in y number (where y is a positive integer greater than 1) of sensor units arranged in the second direction among the plurality of sensor units are respectively connected to different first wirings among the plurality of first wirings,
wherein the plurality of sensor units include at least a first sensor column, a second sensor column, a third sensor column, and a fourth sensor column that are sequentially arranged in the first direction,
wherein a first sensor in an a-th (where a is a positive integer greater than or equal to 1 and less than or equal to y) sensor unit of the first sensor column is electrically connected to a first sensor in a (y−a+1)th sensor unit of the third sensor column, and
a first sensor in an a-th sensor unit of the second sensor column is electrically connected to a first sensor in a (y−a+1)th sensor unit of the fourth sensor column.

15. The display device of claim 12, wherein the plurality of sensor units comprise a first sensor unit and a second sensor unit that are arranged in the second direction,
the first sensor unit includes a first sensor group connected to k number of second wirings among the plurality of second wirings, and
the second sensor unit includes a second sensor group connected to the k number of second wirings.

16. The display device of claim 15, wherein
the first sensor group includes first to k-th second sensors disposed sequentially in the second direction,
the second sensor group includes k-th to first second sensors disposed sequentially in the second direction, and
the first to k-th second sensors of the first sensor group are electrically connected to the k-th to first second sensors of the second sensor group, respectively.

17. The display device of claim 14, wherein
among the plurality of sensor units, x number of sensor units arranged in the first direction and y number of sensor units arranged in the second direction are defined as a sensor block,
the plurality of sensor units further includes a first sensor block and a second sensor block arranged along the first direction, and
each of the first sensor block and the second sensor block comprises x number of sensor columns sequentially arranged in the first direction.

18. An input sensing unit comprising:
a plurality of sensor units arranged in a lattice form in a first direction and a second direction crossing the first direction and including first to x-th sensor columns extending in the second direction,
wherein each of the first to x-th sensor columns includes first to y-th first sensors disposed sequentially in the second direction and first to y-th sensor groups disposed sequentially in the second direction,
each of the first to y-th sensor groups includes first to k-th second sensors disposed sequentially in the second direction,
the first first sensor of the first sensor column is electrically connected to the y-th first sensor of the third sensor column,
the first first sensor of the second sensor column is electrically connected to the y-th first sensor of the fourth sensor column,
the first second sensor of the first sensor group of the first sensor column is electrically connected to the k-th second sensor of the second sensor group of the first sensor column, and
x is a positive integer greater than or equal to 4, y is a positive integer greater than 1, and k is a positive integer greater than 1.

* * * * *